United States Patent [19]

Neuman et al.

[11] Patent Number: 4,960,607
[45] Date of Patent: Oct. 2, 1990

[54] METHOD FOR WEB COATING BY MEANS OF AN ELECTRON BEAM

[75] Inventors: Manfred Neuman; Gerhard ZeiBig; Karl-Heinz Ihle; Eckehard Madler; Siegfried Schiller; Rudolf Schroller, all of Dresden, German Democratic Rep.

[73] Assignee: Bakish Materials Corporation, Englewood, N.J.

[21] Appl. No.: 335,345

[22] Filed: Apr. 10, 1989

[30] Foreign Application Priority Data

Apr. 27, 1988 [DD] German Democratic Rep. ... 315108

[51] Int. Cl.⁵ .................................................. B05D 3/06
[52] U.S. Cl. .......................................... 427/8; 427/42
[58] Field of Search ...................................... 427/8, 42

Primary Examiner—Bernard Pianalto
Attorney, Agent, or Firm—Nolte, Nolte and Hunter

[57] ABSTRACT

In a method for coating strip material by means of an electron beam line evaporator, deflecting in a time-invariant program the electron beam to a plurality of dwell points arranged along a path normal to the direction of strip travel, sensing film thickness in a time-variant programmed mode at a plurality of positions arranged along a course normal to said direction of strip travel and subsequent to said path in said direction of strip travel, controlling in accordance with said programmed mode the dwell of said electron beam at selected dwell points to provide uniform film thickness distribution on said strip.

10 Claims, 1 Drawing Sheet

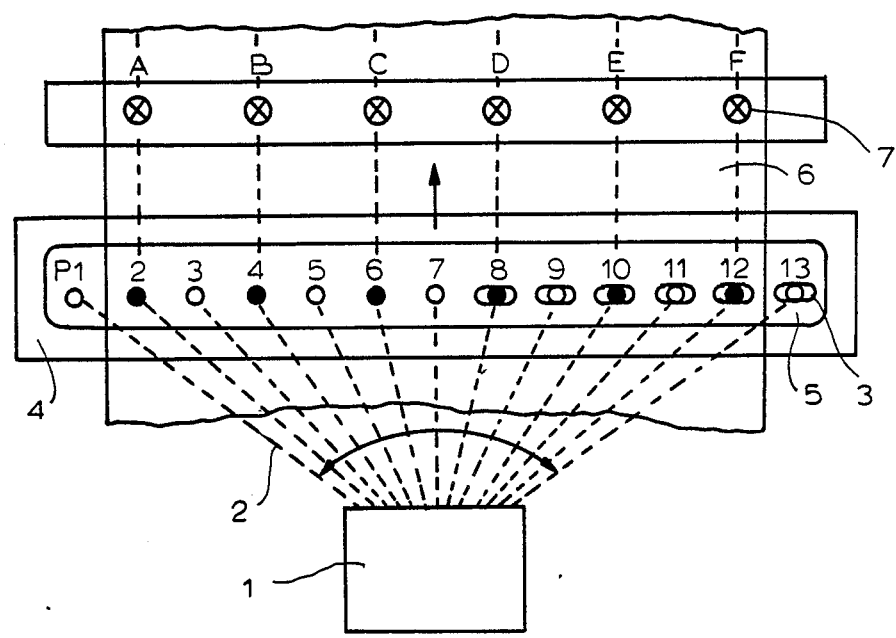
F I G. 1
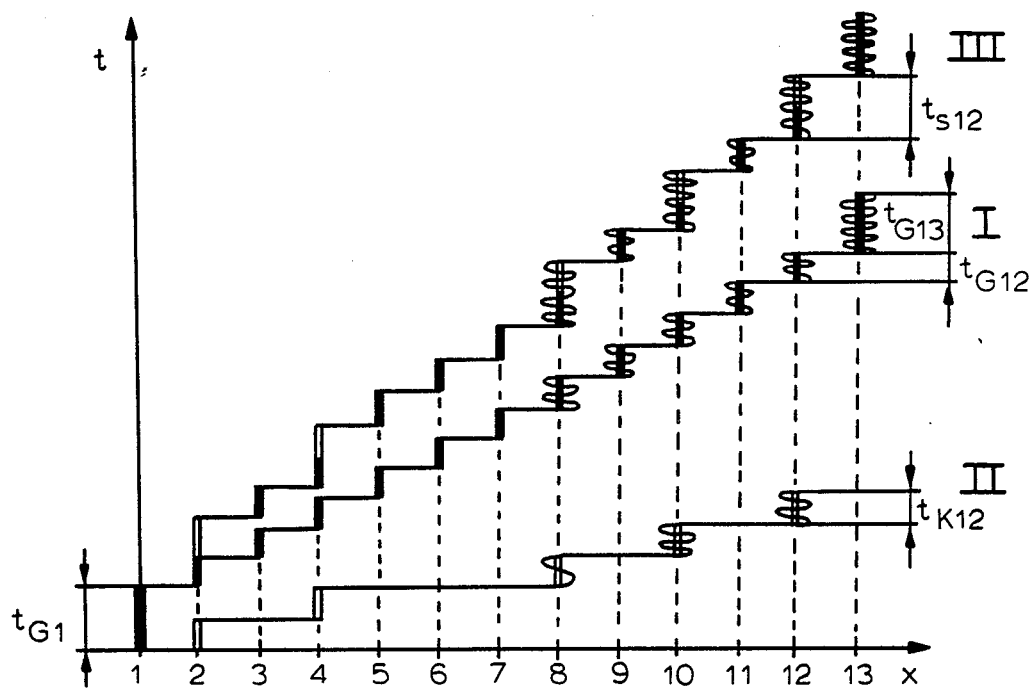
F I G. 2

METHOD FOR WEB COATING BY MEANS OF AN ELECTRON BEAM

OBJECT OF THE INVENTION

The invention relates to a method for coating strip-type materials, especially plastic films and paper, by means of an electron beam line evaporator. The coated material is to be used mainly for the production of roller-type capacitors, reflecting films and packaging materials.

CHARACTERISTIC OF KNOWN ENGINEERING SOLUTIONS

In known web coaters with electron beam line evaporators the electron beam is deflected on a line on the evaporator crucible in an oscillatory manner to heat the evaporant uniformly. In part, evaporation takes place on the line of beam impingement which exhibits an excessive temperature and, in part, on the remaining surface of the molten bath. It has beam shown in practice that a uniform deflection of the electron beam along the evaporator crucible alone does not result in a uniform film thickness transverse to the direction of web motion. This is due to the different focusing of the electron beam along the said line of impingement. As a consequence the power density, and therefore the evaporation rate, must differ also. Moreover, an irregular film thickness transverse to the direction of web motion many also be caused by temperature differences along the crucible due to thermal inhomogeneities of the crucible material. Still another cause of a different film thickness is the limited length of the evaporator crucible and therefore a drop in film thickness at the web edges.

It is known that time-invariant film thickness inhomogeneities over the web width can be compensated by using a non-uniform deflection of the electron beam along the evaporator crucible so that the scanning rate on sites with an inadequate film thickness is reduced whereas it increases at the sites with an excessive film thickness until the film thickness distribution becomes almost equal. This requires the use of an electronically programmable deflection control by which the deflection rate of the electron beam along the total deflection line can be programmed as required.

It was further suggested to correct the time-variant film thickness fluctuations over the web width by automatically changing the said deflection program continuously during coating in compliance with the film thickness distribution measured.

In practice, however, all these suggestions proved to be inadequate because a change in the deflection rate within a certain range of the deflection line results not only in a change of film thickness within the said range but also in the neighbouring zones to an extent that cannot be tolerated. This caused mutual influences and an instability of the control loops so that a practicable application turned out to be impossible.

AIM OF THE INVENTION

The problem of the invention is to create a method which, at only low expenditure, ensures a uniform film thickness distribution during web coating with the aid of the electron beam that reacts immediately to a film thickness fluctuation and therefore reduces the reject rate.

DISCLOSURE OF THE INVENTION

This invention deals with the creation of a method for web coating with the electron beam by means of a line evaporator which ensures a uniform film thickness distribution not only during the staring phase of coating but equally in the case of local changes in the evaporation rate.

The problem is solved according to the invention in that an electron beam is deflected on a line evaporator in programmed mode so that the sensing probes arranged after the line evaporator in direction of the web travel allow to superpose a time-variant correction program on the time-invariant basic program to obain the deflection program of the electron beam along the evaporator crucible. The basic program corresponds to the known deflection program which allows to correct time-invariant film thickness irregularities such as a drop in film thickness at the web edges due to the finite crucible length. The superposed correction program does not act over the total length of the deflection line but solely on discrete sites of the deflection line on which the sensing probes for the film thickness measurement are located.

To this end, the electron beam line evaporator consists of a time-invariant line source and a series of time-variant localized sources in the form of point sources. Surprisingly these so-called point-like correction sources cause no film thickness irregularities being known as typical for coaters with boat evaporators. Obviously this is due to the fact that the main portion of the evaporant is vaporized by the time-invariant line source whereas the time-variant point sources vaporize the corrective proportion only.

The time-invariant basic program for the deflection line may consist of a series of points with dwell times programmed in the known manner whereby the electron beam rapidly jumps from one point to the other, with the number of the said points being at least twice as high than the number of points used in the correction program.

To "blurr" the point-like structure of the deflection line to an almost homogeneous line, and to avoid local overheating with the concurrent splash formation along the deflection line, it proves to be advantageous to superpose a high frequency sweep deflection on the programmed deflection of the electron beam by which the individual points are stretched to obtain short dashes. When selecting a sweep amplitude that is equal to the point spacing one obtains a quasi-continuous deflection line.

It is also possible to obtain a deflection line that consists of line sections instead of swept or non-swept points in which the said line sections are passed by the electron beam at differently programmed deflection rates. Although this method is more expensive it yields the best homogeneity of the deflection line. In this case it is of advantage to use a correction program that comprises line sections also in which the number of the said line sections of the basic program should at least be twice as high. than the number of line sections used in the correction program.

Suitably, the time-variant correction program, superposed on the time-invariant basic program, should consist of so many swept or non-swept points or line sections as the film thickness measuring points used over the total web width. The dwell time of the electron beam on the individual points, or the deflection rate within the individual line sections of the correction program, is controlled directly via the measuring signal of the associated film thickness sensing probe so that like film thickness is obtained on all measuring points.

EXAMPLE OF THE EMBODIMENT INVENTION

In the accompanying drawings

BRIEF DESCRIPTION OF THE DRAWINGS

FIG. 1 is the top view of the electron beam line evaporator assembly and

FIG. 2 is a diagram of both basic program and correction program.

DETAILED DESCRIPTION OF THE DRAWING

Generated in an electron gun, 1, the electron beam 2 deflected in programmed mode along the deflection line 3 on the surface of the evaporator crucible 4 serves to melt and vaporize the evaporant 5. In that way, the evaporator crucible 4 deposits on the web-type plastic film 6 passed over the said crucible a coating the thickness of which is measured in six tracks A through F arranged side by side with the aid of six sensing probes 7 (optical transmission sensing probes) that are also arranged side by side.

The deflection line 3 consists of 13 points, $P_1$ through $P_{13}$, being passed by the electron beam 2 one after the other so that the electron beam 2 jumps from point to point at its maximum deflection rate with a dwell time $t_{G1}$ through $t_{G13}$ on each point that complies with the basic program I shown in the accompanying diagram. The times $t_{G1}$ through $t_{G13}$ of the basic program I are programmed so that, aside from fluctuations in time, a good average film thickness constancy is attained.

Superposed in this time-invariant basic program I is a time-variant correction program II (see FIG. 2). This correction program only acts on the six vaporization points $P_2$; $P_4$; $P_6$; $P_8$; $P_{10}$; $P_{12}$ that are geometrically assigned to the six tracks A through F in an exact manner. According to the film thicknesses measured by means of the sensing probes 7 in the tracks A through F the correction times $t_{K2}$ through $t_{K12}$ are added to the dwell times $t_{G2}$ through $t_{G12}$ of the associated vaporization points $P_2$ through $P_{12}$ until a like film thickness is obtained in all six tracks A through F. Used as reference track is the track in which the greatest film thickness has been measured irrespective of the short dwell time. In the example given this is track C at the instant plotted. On the vaporization point $P_6$ being responsible for this track the correction time $t_{K6}$ is set to zero. In the other five vaporization points the appropriate correction times $t_{K2}$ through $t_{K12}$ are added to the times $t_{G2}$ through $t_{G12}$ of basic program I until the film thickness in all six tracks A through F is equal.

The total dwell times $t_{S1}$ through $t_{S13}$ for the points $P_1$ through $P_{13}$ obtained by the addition of the dwell times $t_{G1}$ through $t_{G13}$ of the basic program I to the times $t_{K2}$ through $t_{K12}$ of the correction program II are plotted in diagram III of the overall program. To ensure that the film thickness in the tracks A through F are not only equal but also correspond with the present nominal values, the power of the electron gun 1 or the transfer rate of the striptype plastic film 6 are controlled accordingly in the known manner.

On the right of deflection line 3 and in the diagrams I through III (points 8 through 13) it is indicated how the deflection points can be extended to short dashes by means of high frequency sweeps so as to further improve the homogeneity of the deflection line. For this, the cycle duration of a sweep oscillation should always be shorter than the shortest adjustable dwell time $t_G$ of the basic program whereas the sweep amplitude shall be equal to or less than the spacing between the points.

In accordance with the invention, the basic program I and the correction program II can also be designed so that, in place of the sweep points, line sections are provided that are passed by the electron beam 2 uniformly at a programmed deflection rate, programming the said deflection rates so that the times needed for passing one line section are equal to the aforesaid dwell times $t_{G1}$ through $t_{G13}$ and $t_{K2}$ through $t_{K12}$ for a point-to-point deflection, respectively.

We claim:

1. In a method for coating strip material by means of an electron beam line evaporator, deflecting in a time-invariant program the electron beam to a plurality of dwell points arranged along a path normal to the direction of strip travel, sensing film thickness in a time-variant programmed mode at a plurality of positions arranged along a course normal to said direction of strip travel and subsequent to said path is said direction of strip travel, controlling in accordance with said programmed mode the dwell of said electron beam at selected dwell points to provide uniform film thickness distribution on said strip.

2. The method of claim 1 further characterized by applying a time-invariant program for deflecting said electron beam along said dwell points and correctively superposing the time-variant program generated by said film thickness sensing upon selected points of said time invariant program.

3. The method of claim 2 further characterized by applying said time invariant program to at least one point not hit by said time variant program, and said point is located between a pair of points hit by said time variant program.

4. The method of claim 3 further characterized by applying both the time variant program and the time invariant program to each of said pair of points.

5. A method as set forth in claim 1 in which the dwell times of the time-variant program are added to the dewll times of the time-invariant program and whereby the dwell time of the time-variant program is set to zero for the point having the greatest measured film thickness.

6. A method as set forth in the claim 1 or 5 in which a high frequency sweep deflection is superposed on the point-to-point deflection of the electron beam along the deflection line whereby the maximum sweep amplitude is equal to the spacing between two points whilst the maximum cycle time of one sweep oscillation is adjusted so that it is equal to the shortest adjustable dwell time of the time invariant program.

7. A method as set forth in the claim 2, 3, 4 or 5 in which the dwell points of the deflection path are lengthened into linear sections and the deflection rate for a linear section is programmed so that the time of a sweep over the linear section corresponds to the dwell time of the dwell point that was lengthened.

8. A method as set forth in claim 2, 3, 4 or 5 in which the dwell points of the deflection path are linear sections and in which a high frequency sweep deflection is superposed along the deflector path and the maximum sweep amplitude is equal to said linear sections and the maximum cycle time to one sweep oscillation is adjusted to equal the shortest linear section of the time-invariant program.

9. A method as set forth in the claim 1 in which the dwell points of the deflection line are lengthened into linear sections and the deflection rate for a linear section is programmed so that the time of a sweep over the linear section corresponds to the dwell time of the dwell point that was lengthened.

10. A method as set forth in claim 1 in which the dwell points of the deflection path are linear sections and in which a high frequency sweep deflection is superposed along the deflection path and the maximum sweep amplitude is equal to said linear sections and the maximum cycle time of one sweep oscillation is adjusted to equal the shortest linear section of the time-invariant program.

* * * * *

UNITED STATES PATENT AND TRADEMARK OFFICE
CERTIFICATE OF CORRECTION

PATENT NO. : 4,960,607
DATED      : 10/2/90
INVENTOR(S) : Bernard Pianalto

It is certified that error appears in the above-identified patent and that said Letters Patent is hereby corrected as shown below:

In Column 4 of the printed patent at line 45, "dewll" should be --dwell--; and

In Column 4 of the printed patent at line 68, "to" should be --of--.

Signed and Sealed this

Twenty-fourth Day of December, 1991

Attest:

HARRY F. MANBECK, JR.

*Attesting Officer*  *Commissioner of Patents and Trademarks*